United States Patent [19]

Posluszny et al.

[11] Patent Number: 5,187,598

[45] Date of Patent: Feb. 16, 1993

[54] OPTICAL PROCESSOR FOR PULSE TRAIN IDENTIFICATION

[75] Inventors: Thomas J. Posluszny, Juno Isles; Dennis W. Davis, Boca Raton, both of Fla.

[73] Assignee: United Technologies Corporation, Hartford, Conn.

[21] Appl. No.: 749,752

[22] Filed: Aug. 26, 1991

[51] Int. Cl.$^5$ .................... G03H 1/16; G02B 27/46; G06E 3/00
[52] U.S. Cl. .................... 359/29; 359/559; 359/563; 364/822
[58] Field of Search .................... 364/822; 359/29, 107, 359/558, 559, 561, 563; 324/77 K

[56] References Cited

U.S. PATENT DOCUMENTS

| | | | |
|---|---|---|---|
| 3,509,565 | 4/1970 | Wilmotte | 343/9 |
| 3,903,407 | 9/1975 | Burnham | 235/181 |
| 4,071,907 | 1/1978 | Casasent | 364/822 |
| 4,073,010 | 2/1978 | Casasent et al. | 364/822 |
| 4,084,255 | 4/1978 | Casasent et al. | 364/822 |
| 4,099,249 | 7/1978 | Casasent | 364/822 |
| 4,389,093 | 6/1983 | Jackson | 359/298 |
| 4,487,476 | 12/1984 | Hester et al. | 382/43 |
| 4,628,473 | 12/1986 | Weaver | 364/822 |
| 4,636,718 | 1/1987 | Labrum et al. | 324/77 |
| 4,712,059 | 12/1987 | Labrum | 324/77 |
| 4,826,285 | 5/1989 | Horner | 364/822 X |
| 5,005,946 | 4/1991 | Brandstetter | 364/822 X |

OTHER PUBLICATIONS

O'Meara et al., *Optical Phase Conjugation* pp. 559, (1983).
Hossack et al., "Coordinate Transformations with Multiple Computer-Generated Optical Elements", *Journal of Modern Optics*, vol. 34, No. 9 1987, pp. 1235-1250.
Maserjian, et al., "Optically Addressed Spatial Light Modulators by MBE-Grown Nipi MQW Structures", *Applied Optics*, vol. 28, No. 22, Nov. 15, 1989, pp. 4801-4807.
"Real-Time Deformation Invariant Optical Pattern Recognition Using Coordinate Transformations", Casasent et al. *Applied Optics*, vol. 26 No. 5, Mar. 1987. pp. 938-942.

*Primary Examiner*—Bruce Y. Arnold
*Assistant Examiner*—David Parsons
*Attorney, Agent, or Firm*—E. W. Petraske

[57] ABSTRACT

A pulse train in the presence of random noise and other pulse trains is identified by controlling pixels in a raster display in accordance with incoming signals; using the raster display to modulate a laser beam with the pulses; Fourier-transforming the modulated beam, then performing a Cartesian to polar coordinate transformation on the Fourier-transformed beam; inverse Fourier transforming the coordinate-transformed beam, and passing the result through a line spatial filter and focusing the filtered beam on a one-dimensional detector array.

5 Claims, 2 Drawing Sheets

OPTICAL PROCESSOR FOR PULSE TRAIN IDENTIFICATION

DESCRIPTION

1. Technical Field

The field of the invention is that of optical signal processing, in particular, the identification of signals amidst background noise.

2. Background Art

The problem of identifying a particular pulse pattern and separating it from random background noise or from other nonrandom signals is an old one in the art. Electrical methods, such as the Watkins-Johnson pulse interval processor, have limited throughput and are thus at a disadvantage in the real-time processing that is usually required. A number of attempts have been made in the art to use optical processing for this problem, but none of them have become accepted.

DISCLOSURE OF INVENTION

The invention relates to an optical processing system for deinterleaving a pulse train from background clutter. The signal data is displayed on a two-dimensional spatial light modulator (SLM) at a frequency approximately equal to the expected frequency of the pulse being looked for. The sought-after repetitive pulse signal will be displayed as a line on the SLM. Pattern recognition of this line among the background is accomplished by taking the Fourier transform of the amplitude distribution of the radiation emitted from the SLM; passing that through a holographic optical element that performs a rectangular to polar coordinate conversion; taking the Fourier transform of the output from the holographic element and passing that through a line spatial filter oriented at a right angle to the linear output of the holographic element; inverse Fourier transforming this result; and then focusing it onto a linear detector array.

Other features and advantages will be apparent from the specification and claims and from the accompanying drawings which illustrate an embodiment of the invention.

BEST MODE FOR CARRYING OUT THE INVENTION

Figure 1:
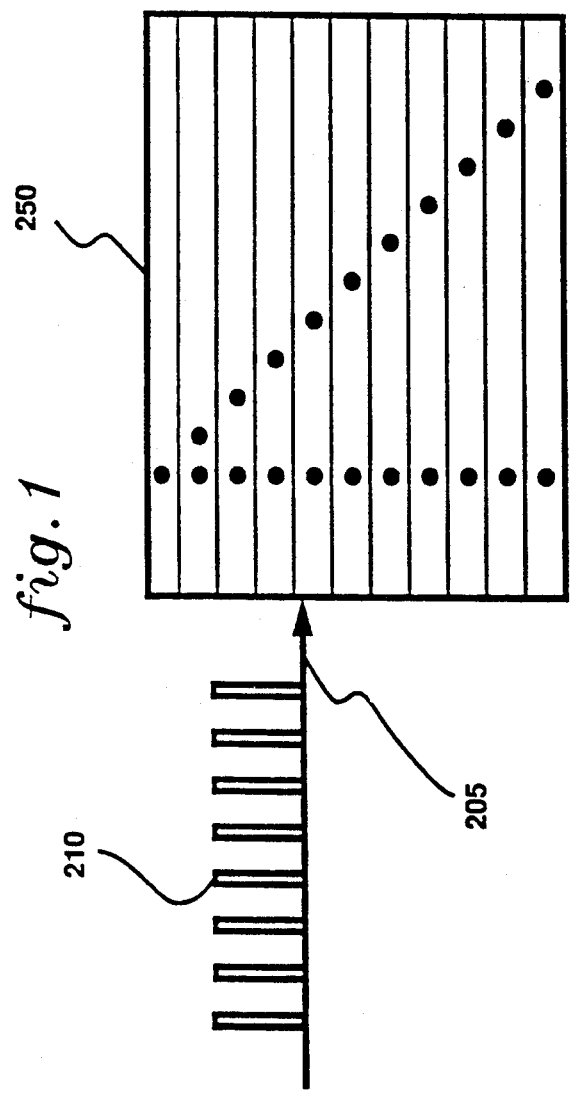
FIG. 1 illustrates schematically an embodiment of the invention.

Referring now to FIG. 1, an incoming pulse train of signals 210 is shown as entering box 250 on line 205. Box 250 represents an SLM and associated electronics for addressing and controlling the pixels, etc. The data is displayed in line sequential raster scan format on the device. If the data display rate or effective "sweep frequency" across the SLM is the same as the repetition frequency of the incoming data, the displayed data or modulated pixels will be displayed on the face of the SLM as a vertical line, as shown in FIG. 1. If the sweep rate is somewhat different from that of the incoming data, the line will be at an angle. There will, of course, be background noise superimposed on the SLM, whether it is random electrical noise or other pulses from all the background signals that are inevitably present.

In the illustrative embodiment, a pixel in the SLM becomes transparent when there is a pulse at the corresponding time so that the energy distribution is a series of dots of light. The opposite approach can also be taken in which data is expressed as a dark pixel against a light background. In the example of FIG. 2a, the data is shown as having a significant angle and being offset by an amount that relates to the phase and frequency differences between the incoming data and the sweep cycle of the SLM. The operation of the SLM will be referred to as presenting an array of pixels, since the pixels are "presented" to an optical beam, for ex. a laser beam that will be modulated by transmission through the SLM to emerge as a modulated laser beam having an amplitude modulated wavefront that carries a representation of the data pattern formed by the pixels on the SLM.

The phrase "carry a representation" is used here as a general term meaning that the amplitude and/or phase of the beam has been modified so that there is a connection between the data and the amplitude and/or phase. The relationship need not be linear and in general will not be.

An optical wavefront having an intensity modulated according to this pattern must be processed in order to move the desired signal from whatever random position it initially assumes to a standard position that can be accepted by the remainder of the system. In a next processing stage, the modulated beam undergoes a coordinate transformation from Cartesian to polar representation that places it in a standard form for recognition, namely a laterally displaced vertical line. For convenience in the terminology, the rows of pixels in SLM define the horizontal, with the vertical being at a right angle. SLM can be rotated at any angle with respect to the usual vertical and horizontal directions.

This laterally displaced vertical line is then correlated with a horizontal slit mask (which constitutes a matched filter for this input). The correlation energy distribution can then be focused into a linear set of detectors in order to provide a manageable task for conventional electronic signal processing.

Figure 2:
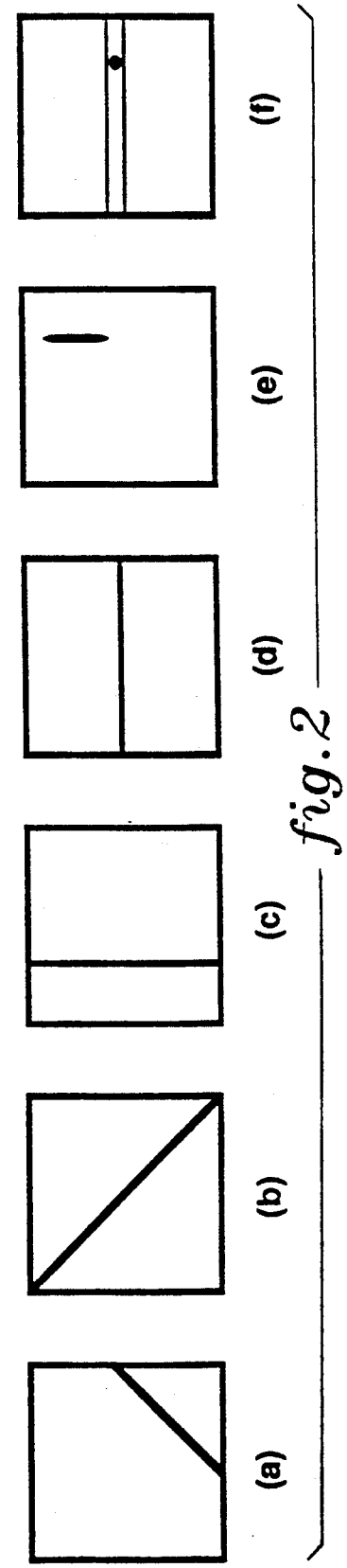
FIGS. 2a through 2f illustrate a series of representations of the energy distribution in the optical beam passing through the system.
Figure 3:
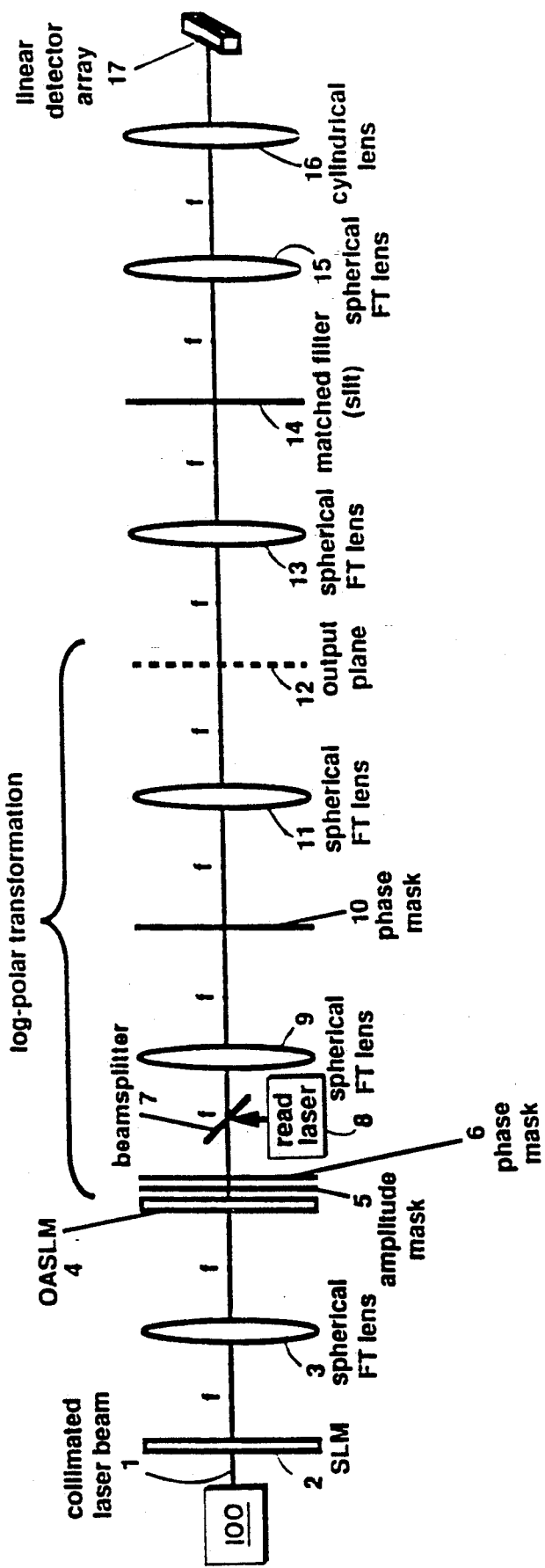
FIG. 3 illustrates in part pictorial, part schematic form an embodiment of the invention.

The details of the aforementioned optical processing are explained with reference to FIG. 3, a schematic of the sequential processing elements, and FIG. 2, a corresponding sequence of image representations of the processed wavefront. Referring now specifically to FIG. 3, there is illustrated a system in which a collimated laser beam 1 from laser 100 is introduced from the left and passes through a transmissive spatial light modulator (SLM) 2, illustratively an array of magneto-optic modulators such as the 128×128 pixel array from SEMETEX Corp. This SLM imparts an intensity modulation across the beam representing the pulse train data image as depicted in FIG. 2a. The Fourier transform of this image is provided at the front face of an optically-addressed spatial light modulator (OASLM) 4 by lens 3. The magnitude of this transform is replicated on the back face of the OASLM as a reflectivity map corresponding to FIG. 2b which depicts a line oriented perpendicular to the input line. This is the case because for any given laterally displaced input object, the amplitude of its Fourier transform remains invariant whereas the Fourier transform phase is altered. Hence, in the instance of a line object, its Fourier transform amplitude profile (which happens to be a line orthogonal to the input line) is constrained to pass through the origin of the Fourier plane independent of shifts in the position of the input line object. By virtue of reflection, this transform magnitude is impressed upon a collimated beam from read laser 8 which is introduced to the back face of the OASLM by via beamsplitter 7. The reflected beam from laser 8 travels to the right carrying the transform magnitude. The beam may, of course, be from laser 100.

Elements 5,6,9,10, and 11, referred to as polar coordinate conversion means for convenience, constitute the set of optics which performs a Cartesian to log-polar (the transform to log-polar is conformal and therefore easier to implement than transformation to a pure polar output and it does not impact the function of the overall system for the purpose of recognizing linear features) coordinate transformation of the intensity appearing on the back face of the OASLM (i.e., a representation of the Fourier transform magnitude of the input image). In the log-polar plane a short vertical streak of energy will occur at a position along the abscissa corresponding to the angular orientation of the line in the Cartesian plane.

The tandem filter approach to this coordinate transform is detailed in Hossack, et al., "Coordinate Transformations with Multiple Computer-generated Optical Elements", *Journal of Modern Optics*, Vol. 34, No. 9, 1987, pg. 1235–1250. Two variations to the Hossack approach are used herein. The first of these is the use of two lenses, 9 and 11, which implement quadratic phase terms in the transformation that would otherwise require some of the resolution available in the holographic optical elements, 6 and 10. With the use of this approach, a hologram of a given spatial resolution will produce a better transform. The second point of departure is related to the fact that elements 5 and 6 are placed at the plane of the OASLM output so as to avoid the need for additional relay optics. Since the read laser traverses both of these elements twice, the single pass amplitude mask is replaced with its square root and the phase mask is reduced by a factor of 2.

The density distribution in amplitude mask 5 is $$A = (x_i^2 + y_i^2)^{-\frac{1}{4}}$$

The phase shift distribution of mask 6 is $$W_{1,2} = \frac{1}{2} \left\{ \begin{array}{l} \left[ y_1 \ln(x_1^2 + y_1^2) - 2x_1 \tan^{-1}\left(\frac{y_1}{x_1}\right) - 2y_1 \right] \frac{k}{2f} \text{ for } x_1 \geq 0 \\ \left[ y_1 \ln(x_1^2 + y_1^2) - 2x_1 \tan^{-1}\left(\frac{y_1}{x_1}\right) - 2y_1 + \pi x_1 \right] \frac{k}{2f} \text{ for } x_1 \leq 0 \end{array} \right\}$$

and the phase shift distribution of mask 10 is $$W_{2,1} = [2 \exp(y_2) \cos(x_2)] \frac{k}{2f}$$

The log-polar map of the Fourier transform magnitude of the input image is present at plane 12 and corresponds to FIG. 2c. It is at this plane that all linear features present in the input image will appear as vertical lines at various lateral displacements. These displacements correspond to the angular orientations of input line features and hence the various data pulse repetition rates represented in the input image. Those skilled in the art will readily appreciate that a detector could be installed at plane 12 to measure the radiation; e.g. by having a two-dimensional photodetector array with lines of vertical pixels wired to sum their outputs. Such a detector would also detect the miscellaneous pulses that will inevitably be present and an amplitude discriminator will be used to differentiate between vertical lines having a number of energized pixels above and below some threshold.

Correlation of the distribution at plane 12 with a matched filter 14 for vertical lines (a horizontal slit shown in FIG. 2d) is achieved with Fourier transform lenses 13 and 15 and provides an output from lens 15 depicted in FIG. 2e. When this distribution is collapsed into one dimension by cylindrical lens 16, a correlation peak in energy occurs at the horizontal position of the aforementioned vertical line at the plane of detector array 17 as shown in FIG. 2f. Elements 13–17 will be referred to as a linear correlation unit for convenience in terminology. The deviation of the pulse repetition frequencies in the input data from a nominal frequency is indicated by the lateral position of this peak.

The input SLM can be a high speed, electronically addressed, binary transmissive device such as a 128×128 pixel magneto-optic SLM available from SEMETEX Corporation of Torrance, California. This device provides a nominal frame rate of 500 Hertz with burst mode operation a 2000 frames/second and a contrast ratio of 104:1. The OASLM can be equally as fast or faster (10's of microseconds frame time) as is disclosed in Maserjian, et al. "Optically addressed spatial light modulators by MBE-grown nipi MQW structures", *Applied Optics*, Vol. 28, No. 22, Nov. 15, 1989, pp. 4801–4807.

It should be understood that the invention is not limited to the particular embodiments shown and described herein, but that various changes and modifications may be made without departing from the spirit and scope of this novel concept as defined by the following claims.

We claim:

1. An optical system for identifying a pulse train of signals present input pulse data containing a pulse train and other pulses, comprising:

an optical source means for transmitting an optical beam along an axis in a first direction;

a spatial light modulator means disposed along said axis or receiving said optical beam and for also receiving said input pulse data and for presenting an array of pixels in a raster display representing input pulse data, whereby said optical beam emerges from said spatial light modulator means as a modulated optical beam carrying a data pattern representative of said input pulse data;

a first Fourier transform lens means disposed along said axis for Fourier-transforming said modulated optical beam to an optical beam carrying a Fourier data pattern;

an OASLM means disposed along said axis for receiving said Fourier data pattern on a first side thereof and for storing said Fourier data pattern in a reflectivity pattern on a second side thereof representative of said optical beam carrying a Fourier data pattern;

means for directing a read optical beam along said axis in a second direction opposite said first direction, whereby said read optical beam is reflected from said second side of said OASLM means with a representation of said Fourier data pattern in said first direction as a read modulated beam; and optical transformation means disposed along said axis in proximity to said second side of said OASLM means for performing a log-polar transformation on said Fourier data pattern, whereby pixels representing said pulse train are represented at an output plane disposed along said axis downstream of said OASLM means as a vertically oriented line of optical radiation displaced from said axis.

2. An optical system according to claim 1, further comprising a filter assembly disposed along said axis downstream of said output plane, said filter assembly comprising second and third Fourier transform lenses bracketing a line spatial filter, all disposed along said axis at positions such that the optical radiation represented at said output plane is filtered by said line spatial filter; and a cylindrical lens means disposed along said axis downstream of said filter assembly for focussing the optical radiation emerging from said line spatial filter onto a linear photodetector array oriented along a transverse axis, whereby the optical radiation is collapsed to an energy distribution along said transverse axis that produces a corresponding amplitude distribution in the output of said linear photodetector array.

3. An optical system according to claim 2, in which said optical transformation means comprises:

an amplitude mask disposed along said axis in proximity to said second side of said OASLM means and carrying a predetermined transform amplitude pattern;

a first phase mask disposed along said axis in proximity to said second side of said OASLM means and carrying a predetermined transform phase pattern, said amplitude and first phase masks each having a first side directed toward said OASLM means and an opposite second side;

a second Fourier transform lens means disposed along said axis for Fourier transforming said read modulated beam emerging from said amplitude and first phase mask to a second phase mask disposed along said axis and carrying a predetermined phase modulation pattern; and a third Fourier transform lens means disposed along said axis for Fourier transforming radiation emerging from said second phase mask to said output plane, said amplitude mask, first phase mask and second phase masks carrying predetermined patterns adapted to perform said log-polar transformation.

4. An optical system according to claim 1, in which said optical transformation means comprises:

an amplitude mask disposed along said axis in proximity to said second side of said OASLM means and carrying a predetermined transform amplitude pattern;

a first phase mask disposed along said axis in proximity to said second side of said OASLM means and carrying a predetermined transform phase pattern, said amplitude and first phase masks each having a first side directed toward said OASLM means and an opposite second side;

a second Fourier transform lens means disposed along said axis for Fourier transforming said read modulated beam emerging from said amplitude and first phase mask to a second phase mask disposed along said axis and carrying a predetermined phase modulation pattern; and a third Fourier transform lens means disposed along said axis for Fourier transforming radiation emerging from said second phase mask to said output plane, said amplitude mask, first phase mask and second phase masks carrying predetermined patterns adapted to perform said log-polar transformation.

5. An optical system for identifying a pulse train of signals present in input pulse data containing a pulse train and other pulses, comprising:

a laser means for transmitting a laser beam along an axis in a first direction;

a spatial light modulator means disposed along said axis for receiving said laser beam and for also receiving said input pulse data and for presenting an array of pixels in a raster display representing input pulse data, whereby said laser beam emerges from said spatial light modulator means as a modulated laser beam carrying a data pattern representative of said input pulse data;

a Fourier transform lens means disposed along said axis for Fourier-transforming said modulated laser beam to a laser beam carrying a Fourier data pattern;

an OASLM means disposed along said axis for receiving said Fourier data pattern on a first side thereof and for storing said Fourier data pattern in a reflectivity pattern on a second side thereof representative of said laser beam carrying a Fourier data pattern;

an amplitude mask disposed along said axis in proximity to said second side and carrying a predetermined transform amplitude pattern;

a first phase mask disposed along said axis in proximity to said second side and carrying a predetermined transform phase pattern, said amplitude and first phase masks each having a first side directed toward said OASLM means and an opposite second side;

means for directing a read optical beam along said axis in a second direction opposite said first direction toward said second sides of said amplitude and phase masks, whereby said read optical beam traverses said amplitude and first phase masks, is reflected from said second side of said OASLM means with a representation of said Fourier data pattern, and traverses said amplitude and first phase masks in said first direction as a read modulated beam;

a second Fourier transform lens means disposed along said axis for Fourier transforming said read modulated beam to a second phase mask disposed along said axis and carrying a predetermined phase modulation pattern;

a third Fourier transform lens means disposed along said axis for Fourier transforming radiation emerging from said second phase mask to an output plane disposed along said axis downstream of said second phase mask, said amplitude mask, first phase mask and second phase masks carrying predetermined patterns adapted to perform a log-polar transformation on said Fourier data pattern, whereby pixels representing said pulse train are represented at said output plane as a vertically oriented line displaced from said axis;

a filter assembly comprising fourth and fifth Fourier transform lenses bracketing a line spatial filter, all disposed along said axis downstream of said output plane such that radiation at said output plane is filtered by said line spatial filter; and a cylindrical lens means disposed along said axis downstream of said filter assembly for focusing radiation emerging from said line spatial filter onto a linear photodetector array oriented along a transverse axis, whereby the radiation distribution present at said output plane is collapsed to an energy distribution along said transverse axis that produces a corresponding amplitude distribution in the output of said linear photodetector array.

* * * * *